United States Patent [19]
Okamoto et al.

[11] Patent Number: 5,963,815
[45] Date of Patent: Oct. 5, 1999

[54] METHOD FOR FORMING A SURFACE-ROUGHENED CONDUCTIVE FILM ON A SEMICONDUCTOR WAFER

[75] Inventors: Yoshihiko Okamoto, Tokyo; Tadashi Yoshida, Hyogo; Hiroshi Ohnishi, Tokyo; Kenichi Hanaoka, Tokyo; Shigeki Nakajima, Tokyo; Junichi Tsuchimoto, Tokyo, all of Japan

[73] Assignees: Mitsubishi Denki Kabushiki Kaisha, Tokyo; Ryoden Semiconductor System Engineering Corporation, Hyogo, both of Japan

[21] Appl. No.: 09/009,966

[22] Filed: Jan. 21, 1998

[30] Foreign Application Priority Data

Jul. 8, 1997 [JP] Japan ................................. 9-182466

[51] Int. Cl.⁶ .................................................. H01L 21/20
[52] U.S. Cl. ............................ 438/398; 438/396; 438/255
[58] Field of Search .................................... 438/255, 253, 438/398, 396

[56] References Cited

U.S. PATENT DOCUMENTS 5,811,344   9/1998   Tu et al. .................................. 438/396

FOREIGN PATENT DOCUMENTS

| 3-263370 | 11/1991 | Japan . |
| 4-290219 | 10/1992 | Japan . |
| 5-110023 | 4/1993 | Japan . |
| 5-175456 | 7/1993 | Japan . |
| 5-343337 | 12/1993 | Japan . |

*Primary Examiner*—Tuan H. Nguyen
*Attorney, Agent, or Firm*—McDermott, Will & Emery

[57] ABSTRACT

An amorphous silicon conductive film on a semiconductor wafer is treated with hydrofluoric acid to remove a natural oxide film therefrom, and then a very thin oxide film is formed on the semiconductor wafer. Thereafter, a silane gas is used to form a nucleating film, followed by annealing to cause the surface of the conductive film be roughened. The very thin oxide film is formed in a thickness of 0.5 angstroms to 20 angstroms. The very thin oxide film is alternatively formed either by treatment with an aqueous hydrofluoric acid solution or by flushing treatment. Thus, a roughened surface having a satisfactory roughness is uniformly formed on the surface of a conductive film on a semiconductor wafer.

6 Claims, 12 Drawing Sheets

| | Reverse bias capacitance / Forward bias capacitance |
|---|---|
| With treatment by an aqueous hydrogen peroxide solution | 0.97 |
| Without treatment by an aqueous hydrogen peroxide solution | 0.97 |

EXPERIMENT ced back. The irregularities on the roughened portion of the storage nodes are originally small, which leads to much smaller irregularities on a roughened surface. Therefore, the enlargement in surface area of the storage node caused by the surface roughening becomes smaller than expected.

METHOD FOR FORMING A SURFACE-ROUGHENED CONDUCTIVE FILM ON A SEMICONDUCTOR WAFER

BACKGROUND OF THE INVENTION

1. Field of the Invention

This invention relates to a method for forming a surface-roughened conductive film adapted for use in semiconductor devices. More particularly, the invention relates to a method for forming a surface-roughened conductive film used for storage nodes for capacitance storage of semiconductor memories.

2. Background Art

A surface-roughened conductive film in semiconductor devices is typically used for formation of storage nodes for forming capacitors in semiconductor memories. A method of formation of the storage nodes is described below.

FIGS. 14(a) to 14(c) show a process of forming storage nodes according to a conventional method. As shown in FIG. 14(a), a doped amorphous silicon conductive film is formed on a silicon oxide film 1 on a semiconductor wafer, and then the doped amorphous silicon conductive film is etched to form storage nodes 2. Subsequently, as shown in FIG. 14(b), a surface roughening treatment is carried out. Roughened grains are likely to be formed on the oxide film 1, but are not likely to be well formed on the storage nodes 2. As shown in FIG. 14(c), the roughened grains on the oxide film 1 are etched back and removed. At this time, the roughened grains on the storage nodes 2 are also etched back. Therefore, it is difficult to form a satisfactorily roughened surface on the storage node 2.

FIG. 15 is a flowchart showing a conventional process for forming storage nodes. Conventionally, in order to form storage nodes of semiconductor memories, a clean surface is provided after removing a natural oxide film formed by exposure to, for example, air, subsequent to formation of amorphous silicon. (See, for example, Bulletins of the 38th Meeting of the Society of Applied Physics (Spring of 1991), 31a-T4, 5, or Japanese Laid Open Patent Application No. 4-252018, and the like).

A known process of forming storage nodes is explained with reference to FIG. 15. In step 11, a conductive film made of amorphous silicon is etched to form storage nodes, followed by RCA cleaning in step 12 and HF cleaning in step 13. HF cleaning is effected such that a natural oxide film, having been formed on the surface of the storage nodes formed of amorphous silicon, is removed by means of an aqueous hydrofluoric acid. Hence, the terminated surface is provided with hydrogen to a degree as much as possible, suppressing the adsorption of oxygen. Immediately after the HF cleaning, a surface roughening treatment is initiated in step 15. This roughening treatment includes forming a nucleating film by use of a disilane gas and then subjecting to annealing treatment, thereby forming a roughened surface. Subsequently, the roughened nucleating film formed on the oxide film, which isolates storage nodes therewith, is etched back, forming separated, surface-roughened storage nodes in step 16.

The conventional roughening method is disadvantageous in that the surface roughness of the oxide film which isolates storage nodes are different from that of the storage nodes. Hence, the irregularities tend to be smaller on the roughened surfaces of the storage node. Accordingly, when the roughened nucleating film formed on the isolating oxide film is removed by etching back, the roughened portion on the respective storage nodes is likewise etched back. The irregularities on the roughened portion of the storage nodes are originally small, which leads to much smaller irregularities on a roughened surface. Therefore, the enlargement in surface area of the storage node caused by the surface roughening becomes smaller than expected.

The nucleating film formed by use of a disilane gas is influenced by the properties of the underlying layer, on which the film is formed. Hence, surface roughening may not be wholly accomplished. Thus, the stable formation of a roughened surface is not satisfactory.

SUMMARY OF THE INVENTION

The present invention has been made so as to solve the problems involved in the conventional art and provides a method for uniformly forming a roughened surface, which has a satisfactory surface roughness, on a conductive film of a wafer. The invention provides a method wherein, in semiconductor memories, surface-roughened storage nodes having a high capacitance factor can be uniformly formed on the entire surface of a wafer.

According to one aspect of the present invention, in a method for forming a surface-roughened conductive film on a semiconductor wafer, an amorphous silicon conductive film formed on the semiconductor wafer is subjected to treatment with hydrofluoric acid to remove a natural oxide film therefrom. A very thin oxide film is formed on the conductive film following the treatment with hydrofluoric acid. A nucleating film is formed on the very thin oxide film by use of a silane gas. Then, the wafer having the nucleating film is annealed to roughen the surface of the conductive film.

In the method for forming a surface-roughened conductive film, the very thin oxide film is formed preferably in a thickness range from 0.5 angstroms to 20 angstroms.

In the method for forming a surface-roughened conductive film, the very thin oxide film may be formed by treatment with an aqueous hydrogen peroxide solution.

In the method for forming a surface-roughened conductive film, the very thin oxide film may be formed by flushing treatment with an oxidizer.

According to another aspect of the present invention, in a method for forming a surface-roughened conductive film on a semiconductor wafer, an amorphous silicon conductive film formed on a semiconductor wafer is etched, and then an oxide film is formed on the conductive film. The semiconductor wafer is subjected to treatment with hydrofluoric acid until the oxide film is left as a very thin oxide film having a thickness ranging from 0.5 angstroms to 20 angstroms. A nucleating film is formed on the very thin oxide film by use of a silane gas. Then, the wafer having the nucleating film is annealed to roughen the surface of the conductive film.

In the method for forming a surface-roughened conductive film, the oxide film may be formed either by flushing with an oxidizer or by oxygen ashing.

In another aspect of the present invention, a semiconductor device is obtained which comprises a surface-roughened conductive film on a semiconductor wafer which is formed according to either of the methods defined as above.

Other and further objects, features and advantages of the invention will appear more fully from the following description.

BEST MODE OF CARRYING OUT THE INVENTION

Referring now to the accompanying drawings, some embodiments of the present invention are described wherein the methods of formation of surface-roughened storage nodes in a semiconductor memory are illustrated.

First Embodiment

Figure 1:
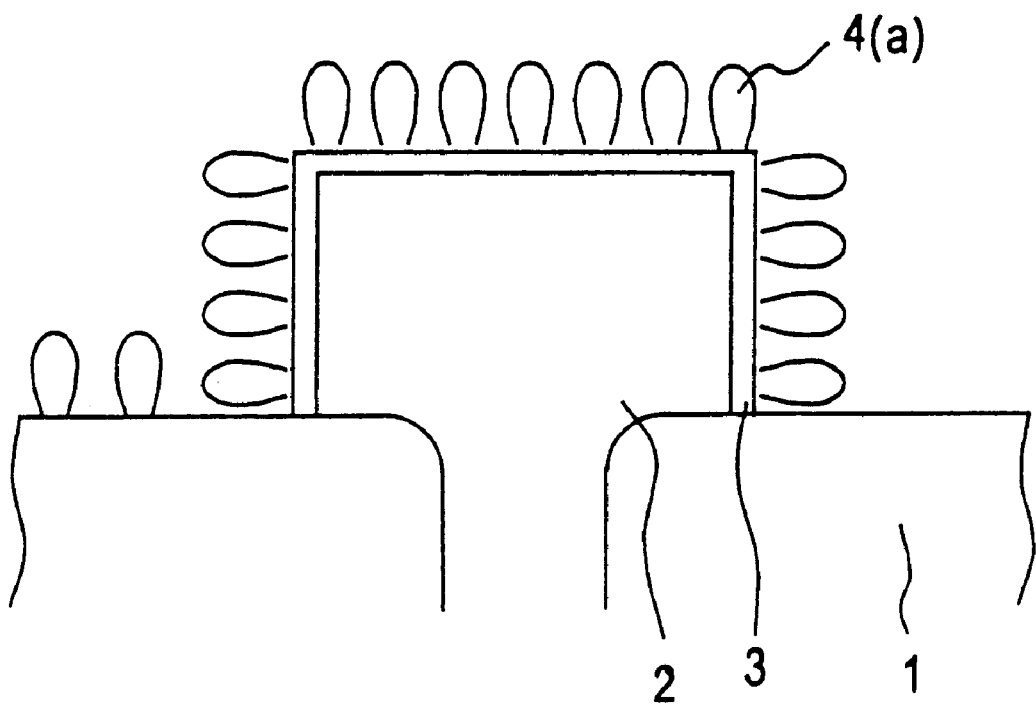
FIG. 1 is a schematic view illustrating a surface-roughened state of a storage node obtained by a method for forming surface-roughened storage nodes according to a first embodiment of the present invention.

FIG. 1 is a conceptional schematic view illustrating a surface-roughened state of a storage node obtained by each method for forming surface-roughened storage nodes according to each embodiment of the present invention. In FIG. 1, a silicon oxide film 1 is formed on a silicon wafer (not shown), a storage node 2 made of amorphous silicon is formed on the silicon oxide film 1, a very thin oxide film 3 is formed on the storage node 2, and surface-roughening grains 4a are formed on the very thin oxide film 3, i.e. the storage node 2. As shown in the figure, the surface-roughened storage node of this embodiment is satisfactorily formed with the roughening grains 4a on the storage node 2.

Although schematically shown in FIG. 1, the very thin oxide film 3 does not serve as an insulating film, but ensures electric conduction between the storage node 2 and the roughening grains 4a after the roughening process. FIG. 1 shows that the very thin oxide film 3 is formed on the entire surface of the storage node 2. If, however, the very thin oxide film 3 is extremely thin, this may not be formed on the entire surface of the storage node 2 or may not be formed as a continuous film on the entire surface of the wafer, but may be in the form of islands.

Figure 2:
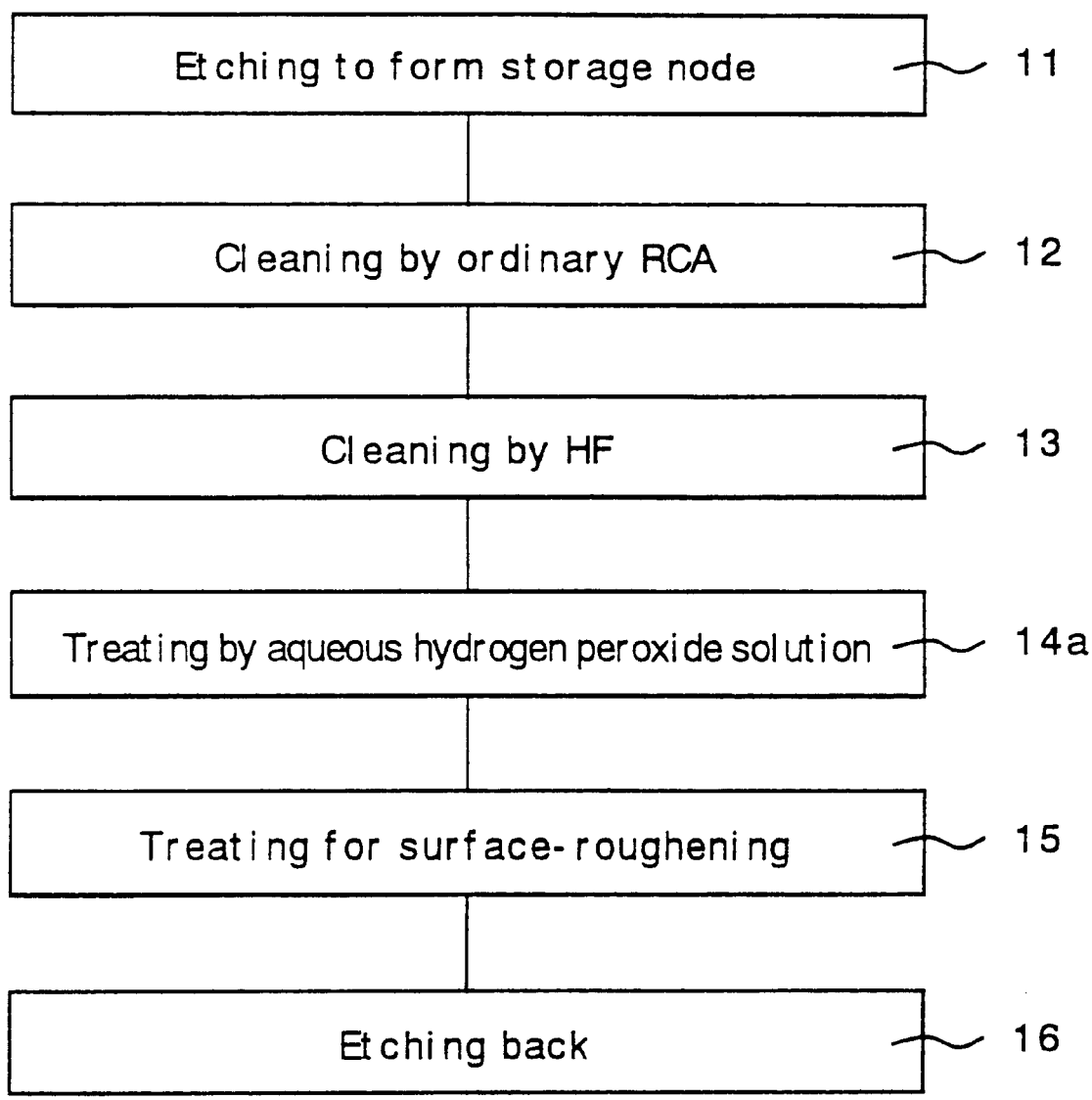
FIG. 2 is a flowchart showing a process of forming a surface-roughened storage node according to the first embodiment of the present invention.

FIG. 2 is a flowchart showing a process of forming a surface-roughened storage node according to the first embodiment of the present invention. The formation process is explained with reference to FIGS. 1 and 2. In step 11 of FIG. 2, a doped amorphous silicon film on a semiconductor wafer is etched to form a storage node 2. Subsequently, ordinary RCA cleaning is effected in step 12. In step 13, a natural oxide film and the like formed on the surface of the storage node 2 are removed by treatment with an aqueous hydrofluoric acid solution.

Immediately after the removal, in step 14a, treatment with an aqueous hydrogen peroxide solution is performed to form a very thin oxide film 3 in the form of a continuous film or islands on the surface of the storage node 2. In step 15, an approximately 500 angstroms thick amorphous silicon film is formed by use of a disilane gas (Si2H6) to form a nucleating film, followed by annealing to permit surface-roughening grains 4a to grow. Thereafter, the roughening grains grown on the isolation oxide film are removed by etching back, thereby completing the surface-roughened storage node.

As will be apparent from the above, this embodiment is characterized in that in step 14a, after the treatment with an aqueous hydrofluoric acid solution in step 13 and prior to the formation of the nucleating film in step 15, the very thin oxide film 3 is formed on the surface of the storage node 2 by treatment with an aqueous hydrogen peroxide solution.

The purpose of forming the very thin oxide film 3 on the storage node 2 is to form, on the storage node 2, the surface-roughening grains 4a (silicon grains) equal in size to those grains (silicon grains) on the isolation oxide film 1 via the formation of the nucleating film and subsequent annealing.

Figure 3A:
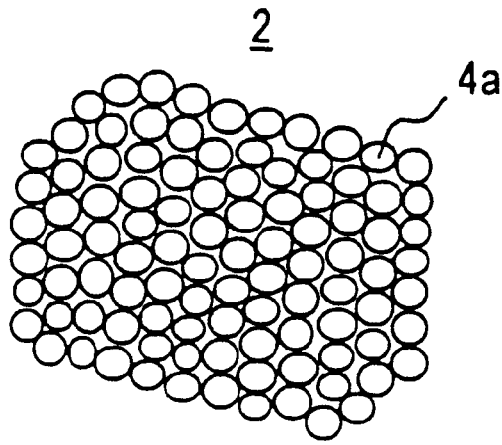
FIGS. 3(a) and 3(b) are schematic views showing a sketch from a photograph of the roughened storage node formed according to the first embodiment of the present invention or formed according to a conventional method.
Figure 3B:
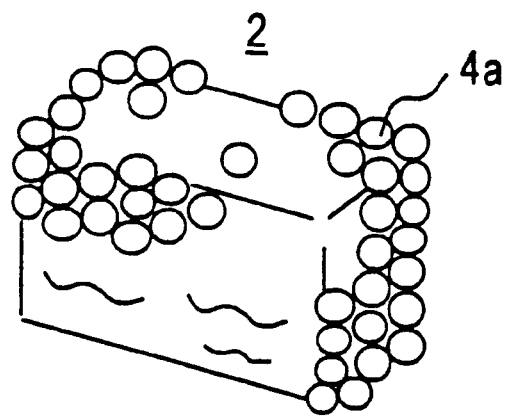

FIGS. 3(a) and 3(b) are schematic views showing a sketch from a photograph of the roughened storage node formed by the above method in comparison with a sketch from a photograph of a storage node formed according to a conventional method. FIG. 3(a) shows the node formed according to this embodiment, revealing that the roughening grains 4a are densely formed on the storage node. On the other hand, FIG. 3(b) shows the node formed by the known method, in which the roughened surface is as experienced with the case where no treatment with an aqueous hydrogen peroxide solution has been performed. In FIG. 3(b), grain boundaries in the roughened surface are not clearer in comparison with the case of FIG. 3(a). In addition, any roughening grains are not wholly formed as shown.

Figure 4A:
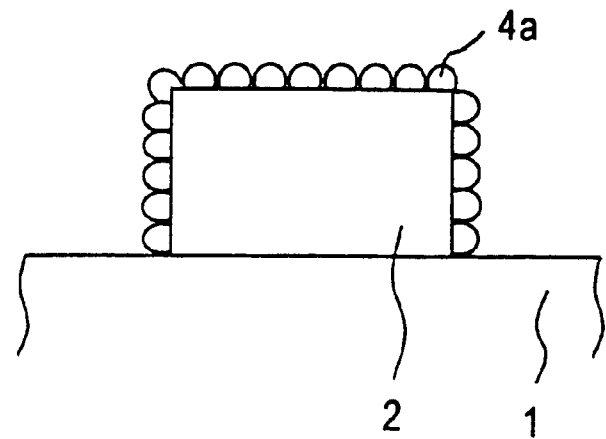
FIGS. 4(a) and 4(b) are schematic views sketching a photograph of the cross section of the storage node formed according to the first embodiment of the present invention, or according to the conventional method.
Figure 4B:
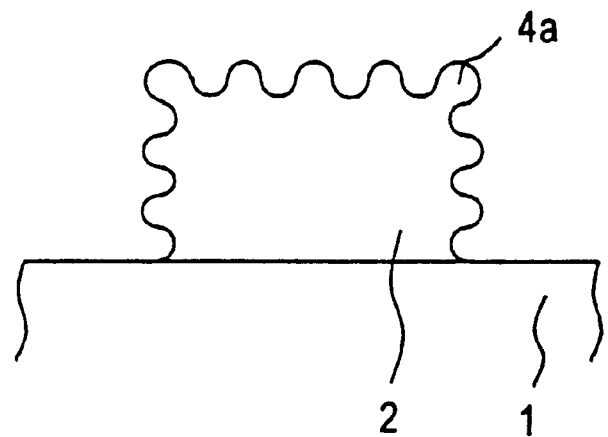

This will be clearly seen from a photograph showing the cross section of the storage node. FIGS. 4(a) and 4(b) are schematic views each sketching a photograph of the cross section of the storage node, wherein FIG. 4(a) is the cross section when formed according to the method of this embodiment, and FIG. 4(b) is the cross section obtained when any treatment with an aqueous hydrogen peroxide solution is not performed according to the known method. FIG. 4(b) reveals that grains are not wholly grown, and the valley between adjacent grains 4a is relatively shallow. In contrast, it will be seen from FIG. 4(a) that the well-defined roughening grains 4a are formed on the entire surface of the storage node.

Figures 5, 6:
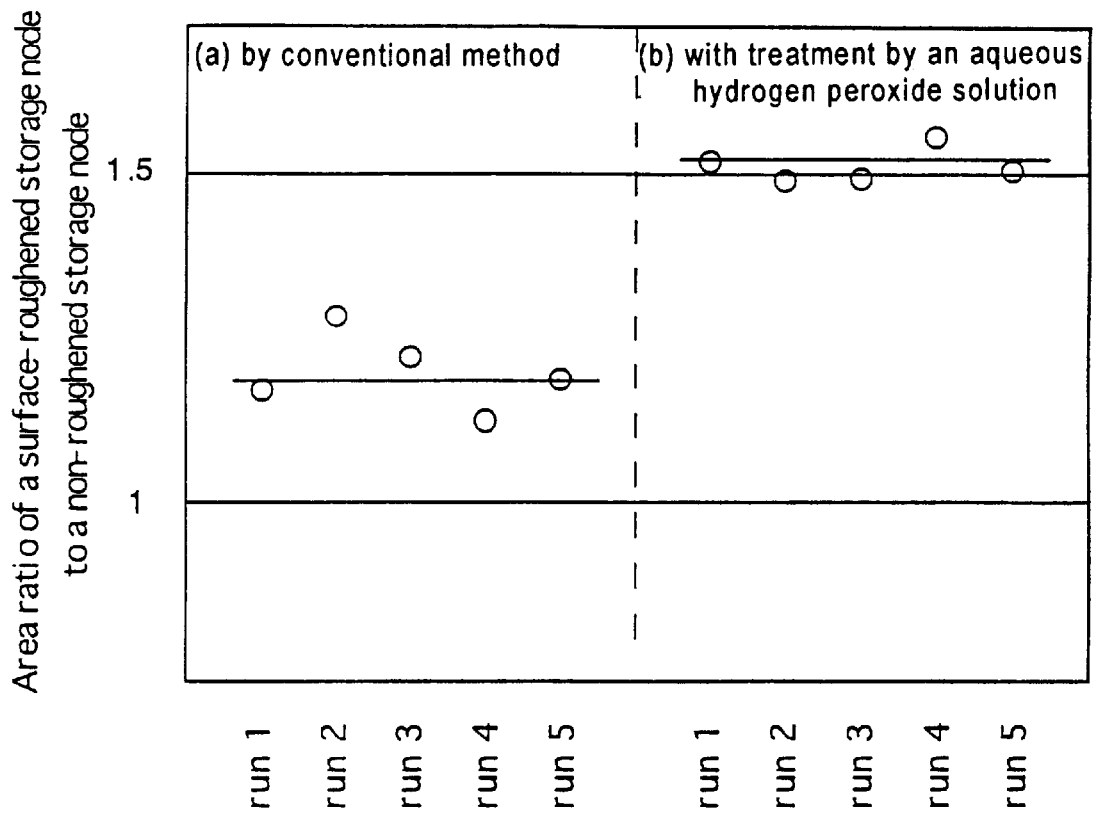
FIG. 5 shows an area ratio, to a non-roughened storage node, of the surface-roughened storage node formed according to the first embodiment of the present invention or the roughened storage node formed according to the conventional method.
FIG. 6 shows a table including a ratio of reverse and forward bias storage node capacitance of the storage node formed according to the first embodiment of the present invention, or according to the conventional method.

FIG. 5 shows an area ratio, to a non-roughened storage node, of the surface-roughened storage node formed according to the first embodiment of the present invention, or the roughened storage node formed according to the known method without any treatment by an aqueous hydrogen peroxide solution. Under conditions for forming a nucleating film on a storage node with the same profile, the area ratio of the node, shown as (b), subjected to the treatment by the aqueous hydrogen peroxide solution is greater than that of the node, shown by (a), formed by the known method.

When an oxide film is formed on the storage node surfaces by treatment with an aqueous hydrogen peroxide solution, there exists the possibility that the formed very thin oxide film 3 is strongly deposited after the formation of the nucleating film and the annealing treatment, and that the roughening grains 4a are not formed integrally with the storage node. As a result, when a reverse bias is applied to the storage node, the roughening grains 4a do not serve as a storage node and cannot provide a capacitance corresponding to an increased area ratio.

FIG. 6 depicts a table showing, for comparison, ratio of reverse and forward bias storage node capacitance for the case where treatment by an aqueous hydrogen peroxide is effected and the conventional method where any treatment by an aqueous hydrogen peroxide solution is not effected. As will be apparent from the table for comparison in FIG. 6, the ratios between the capacitance determined on application with reverse bias or forward bias are 0.97. Thus, there is no difference therebetween. Hence, even when the very thin oxide film is formed on the surface of the storage node prior to the formation of the nucleating film by treating with an aqueous hydrogen peroxide solution, satisfactory electric circuit operation is ensured after treatments in subsequent steps.

When treatment with an aqueous hydrogen peroxide solution is not performed according to a conventional method, roughening grains do not grow on some storage nodes on the wafer, and such storage nodes cannot eventually yield any capacitance (see FIG. 3(b)). The presence of such defective storage nodes influences the reliability of the resultant device owing to the shortage in capacitance of the capacitor. In contrast, as shown in FIG. 3(a), in the embodiment where the treatment with an aqueous hydrogen peroxide solution is performed, roughening grains are found on the entire surface of a wafer. In fact, evaluating the reliability of devices reveals that when the treatment with an aqueous hydrogen peroxide solution is performed, the probability of occurrence of defectives ascribed to the shortage of capacitance is $1/1000$ or below when compared with that of the conventional art.

According to this embodiment, a very thin oxide film is preliminarily formed on storage nodes, such that the difference between the size of the roughening grains on the storage nodes and the isolation oxide film is suppressed. The surface of the storage node is covered with the very thin oxide film to make the roughened surface uniform, thereby preventing the local occurrence of a portion which cannot be roughened on the surface thereof. Since the oxide film formed on the storage nodes is very thin, thermal diffusion of doped phosphorus, which is provided to electrically combine the nucleating film and the storage node in the annealing step, is ensured.

Thus, the roughened surface which is allowed to establish electric conduction is formed having a satisfactory surface roughness, thereby permitting the entire surface to be uniformly roughened.

In semiconductor memories, surface-roughened storage nodes having a high capacitance factor can be uniformly formed on an entire wafer surface.

Second embodiment

Figure 7:
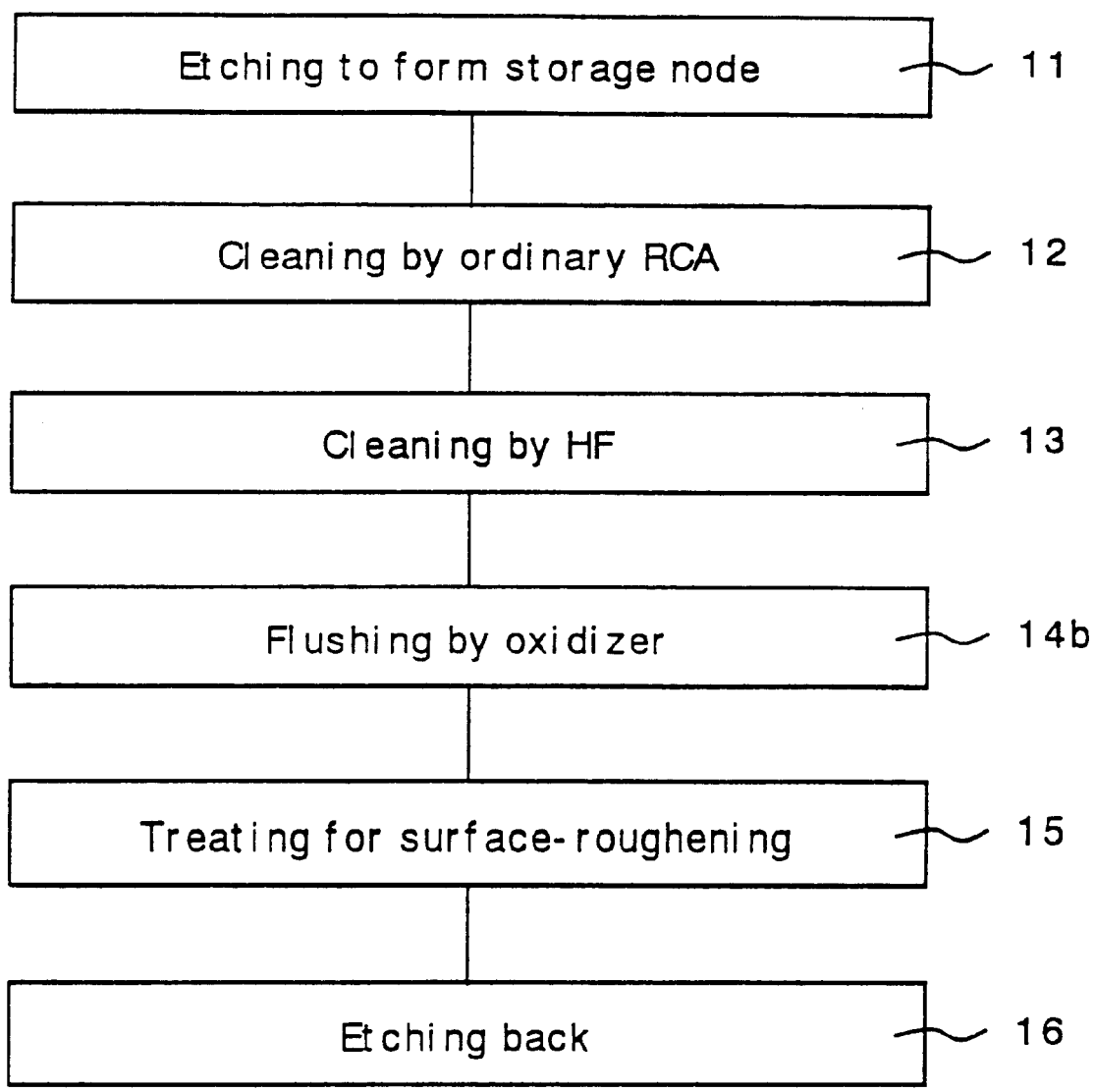
FIG. 7 is a flowchart showing the steps of forming surface-roughened storage nodes according to a second embodiment of the present invention.

FIG. 7 is a flowchart showing the steps of forming surface-roughened storage nodes according to a second embodiment of the present invention.

In the steps of the second embodiment shown in FIG. 7, etching the formation of storage nodes in step 11, RCA cleaning in step 12 and cleaning with hydrofluoric acid in step 13 are similar to those of the first embodiment.

In the second embodiment, the storage nodes 2 of the wafer treated by hydrofluoric acid are subsequently subjected to flushing treatment with an oxidizer in step 14b. The oxidizer flushing treatment includes, for example, a plasma discharge treatment in an atmosphere of oxygen. As a result, a very thin oxide film is formed on the surface of the individual storage nodes 2. The oxidizer may include oxygen, ozone, nitrogen monoxide, nitrogen dioxide and the like.

After the flushing treatment with an oxidizer, a surface roughening treatment, in step 15, and an etching back treatment, in step 16, are conducted similarly to those of the first embodiment.

In this way, the difference between the first and second embodiments resides in that the flushing treatment with an oxidizer is used in place of the treatment with an aqueous hydrogen peroxide solution.

Figure 8:
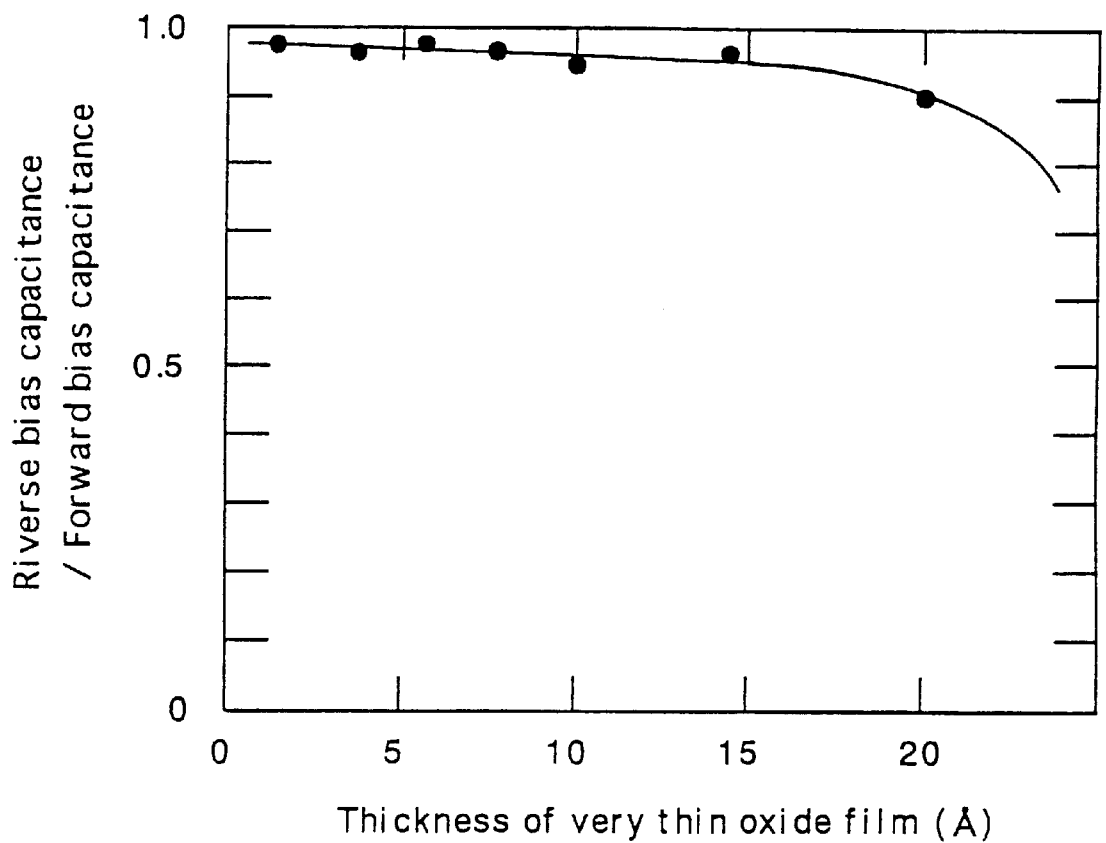
FIG. 8 shows a ratio between the reverse bias capacitance and the forward bias capacitance in relation to the thickness of the thin oxide film on the storage node formed according to the second embodiment of the present invention.

FIG. 8 shows a ratio between the capacitance determined on application of a reverse bias and the capacitance determined on application of a forward bias (reverse bias capacitance/forward bias capacitance) in relation to the thickness of the very thin oxide film 3 on the storage node 2 formed according to the second embodiment. As illustrated in FIG. 8, an increasing thickness of the very thin oxide film 3 results in the lowering of the capacitance ratio, and the ratio lowers to 0.9 when the oxide film thickness is 20 angstroms. A device yield ratio of 0.9 reveals that the yield compares with that in a conventional art. Accordingly, the thickness of the very thin oxide film must be 20 angstroms or below.

Figure 9A:
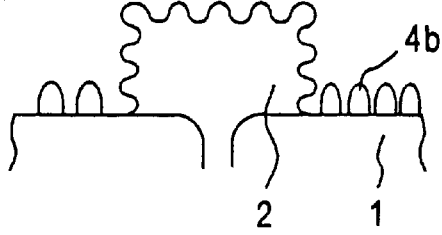
FIGS. 9(a) and 9(b) are a schematic view illustrating the relation between the thickness of the thin oxide film and the roughening grains on the storage node according to the second embodiment of the present invention, or according to the conventional method.
Figure 9B:
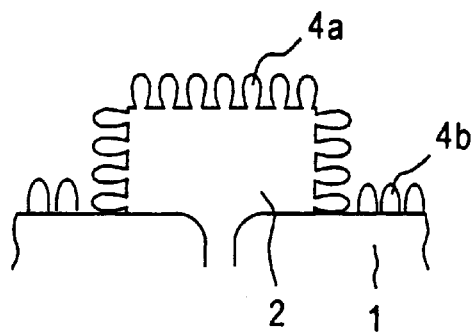

FIG. 9 is a schematic view illustrating the relation between the thickness of the very thin oxide film 3 and the roughening grains on the storage node 2. As shown in FIG. 9(a), when the thickness of the very thin oxide film 3 is smaller than 0.5 angstroms, large-size roughening grains 4a are formed on the oxide film 1, and grains on the storage node 2 become smaller in size. Thus, the surface roughness is unsatisfactory. As shown in FIG. 9(b), when the thickness of the very thin oxide film 3 is in the range of 0.5 angstroms to 20 angstroms, large-size roughening grains are formed on the storage node 2, similar to those formed on the very thin oxide film 1. However, when the thickness of the very thin oxide film 3 exceeds 20 angstroms, the capacitance is not satisfactory for use as a device, although no problem is involved in the formation of roughening grains. As a consequence, it has been found that the very thin oxide film 3 must be formed in the range of from 0.5 angstroms to 20 angstroms in thickness.

Where the very thin oxide film 3 is formed as being relatively thick in the range of 0.5 angstroms to 20 angstroms, a continuous film is formed. Where the thickness is close to 0.5 angstroms and is thus very small, the film may be formed on the wafer surface or the surface of the storage node in the form of islands or in the form of spots or patches.

Various oxidizer flushing conditions may be used to form the oxide film 3. When an oxidizer having strong oxidative power, such as ozone or nitrogen dioxide, is used, flushing of a gas at room temperature is sufficient for this purpose. When a gas, e.g. oxygen or nitrogen monoxide, stable at room temperature is used, flushing proceeds satisfactorily without involving any problem either on use of a plasma or on heating of a wafer to approximately 200° C.

As set out above, the roughened surface is ensured with good electric conduction and can be uniformly formed on the surface of the conductive film. In this way, surface-roughened storage nodes having a high capacitance factor can be formed in semiconductor memories.

Third embodiment

Figure 10:
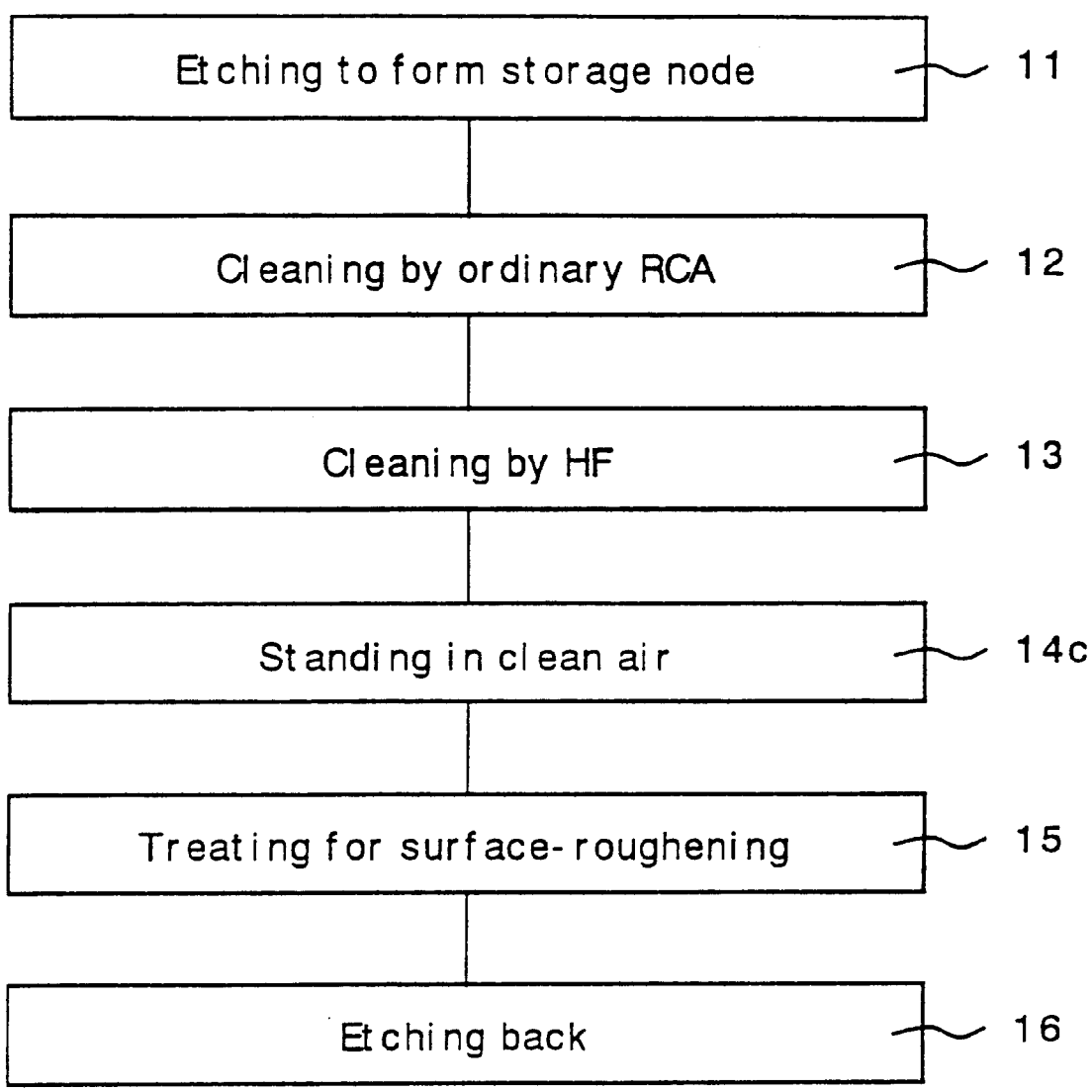
FIG. 10 shows a flowchart illustrating the steps of forming surface-roughened storage nodes according to the third embodiment of the present invention.

FIG. 10 shows a flowchart illustrating the steps of forming surface-roughened storage nodes according to the third embodiment of the present invention.

In the steps of the third embodiment, etching for forming storage nodes in step 11, RCA cleaning in step 12 and cleaning with hydrofluoric acid in step 13 are effected in the same manner as in the first embodiment.

In the third embodiment, the hydrofluoric acid-treated wafer is allowed to stand in a clean room for a period of time in step 14c, the time sufficient to cause an oxide film to grow. For instance, if it takes 4 hours of time standing in the clean room, an oxide film about 0.8 angstroms thick grows. Thereafter, roughening treatment, in step 15, and etching back treatment, in step 16, are carried out as in the first embodiment.

As a result, roughening grains 4a can be formed on the surface of the storage nodes 2, similar to the first embodiment. When this is applied to a device, capacitance and reliability are the same level as in the first embodiment.

As set out above, the difference between the first embodiment and the fourth embodiment resides in the provision of a standing time in a clean room after treatment with hydrofluoric acid in place of the treatment with an aqueous hydrogen peroxide solution.

As described hereinabove, according to this embodiment, the roughened surface ensures good electric conduction and can be uniformly formed on the surface of the conductive film. In this way, surface-roughened storage nodes having a high capacitance factor can be formed in semiconductor memories.

Fourth Embodiment

Figure 11:
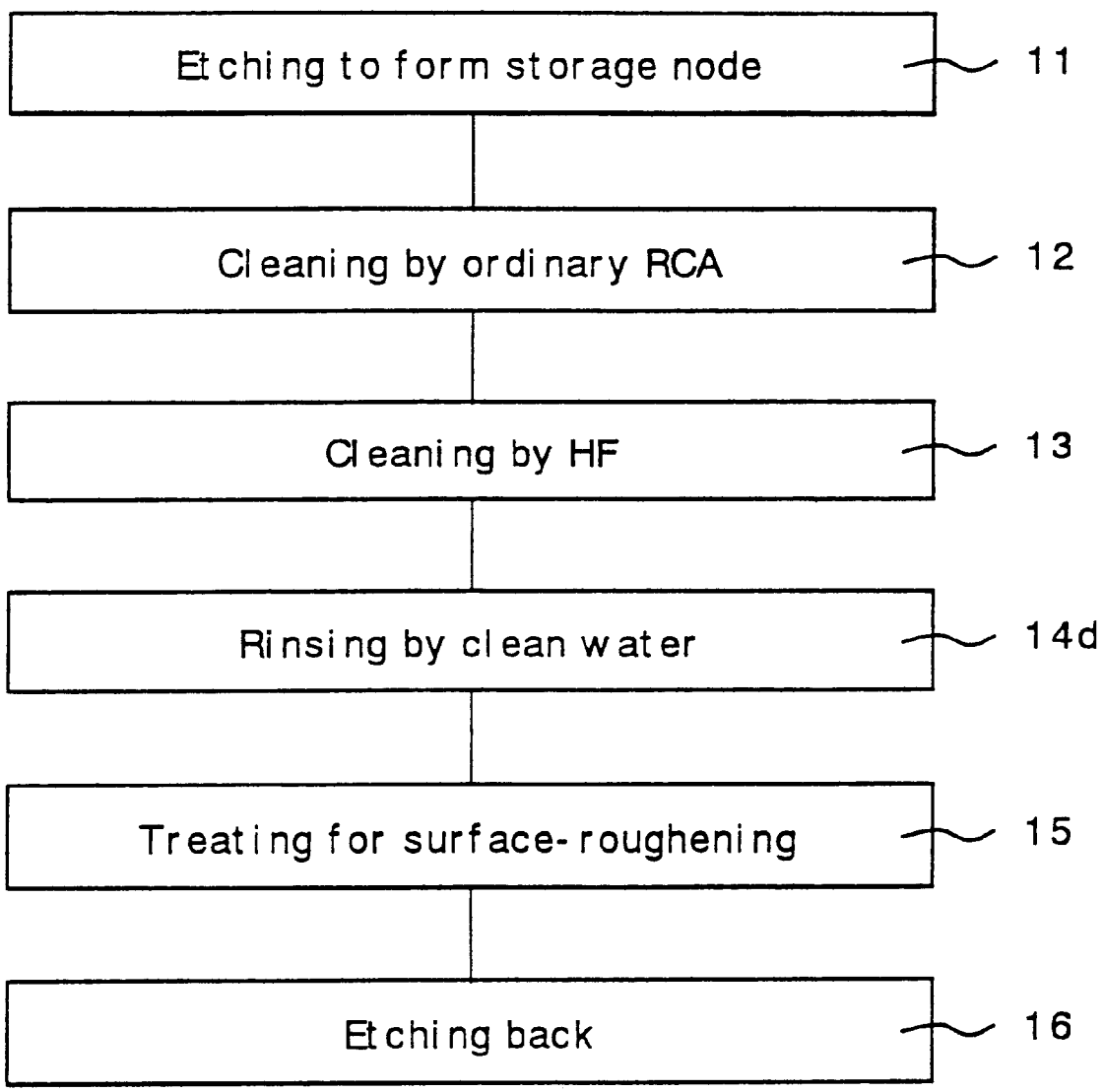
FIG. 11 is a flowchart showing the steps of forming surface-roughened storage nodes according to a fourth embodiment of the present invention.

FIG. 11 is a flowchart showing the steps of forming surface-roughened storage nodes according to a fourth embodiment of the present invention.

In the steps of the fourth embodiment shown in the flowchart of FIG. 11, etching for forming storage nodes in step 11, RCA cleaning in step 12 and cleaning with hydrofluoric acid in step 13 are effected in the same manner as in the first embodiment. In the hydrofluoric acid treating step of step 13, rinsing of the wafer with pure water is included in the step, and a drying treatment is further effected after the rinsing with pure water.

In the fourth embodiment, the rinsing by clean water is continued over a long time in step 14d. As a result, an oxide film is formed on the surface of the storage nodes. For the purpose of forming the oxide film, the rinsing treatment is continued over 1 hour, resulting in an that an oxide film about 1 angstrom thick formed on the surface of the storage node 2. Roughening treatment, in step 15, and etching back treatment, in step 16, are carried out as in the first embodiment.

As a result, good characteristics of the storage nodes comparable with those of the first embodiment can be obtained.

As set out above, the roughened surface ensures good electric conduction and can be uniformly formed on the surface of the conductive film. In this way, surface-roughened storage nodes having a high capacitance factor can be formed in semiconductor memories.

Fifth embodiment

Figure 12:
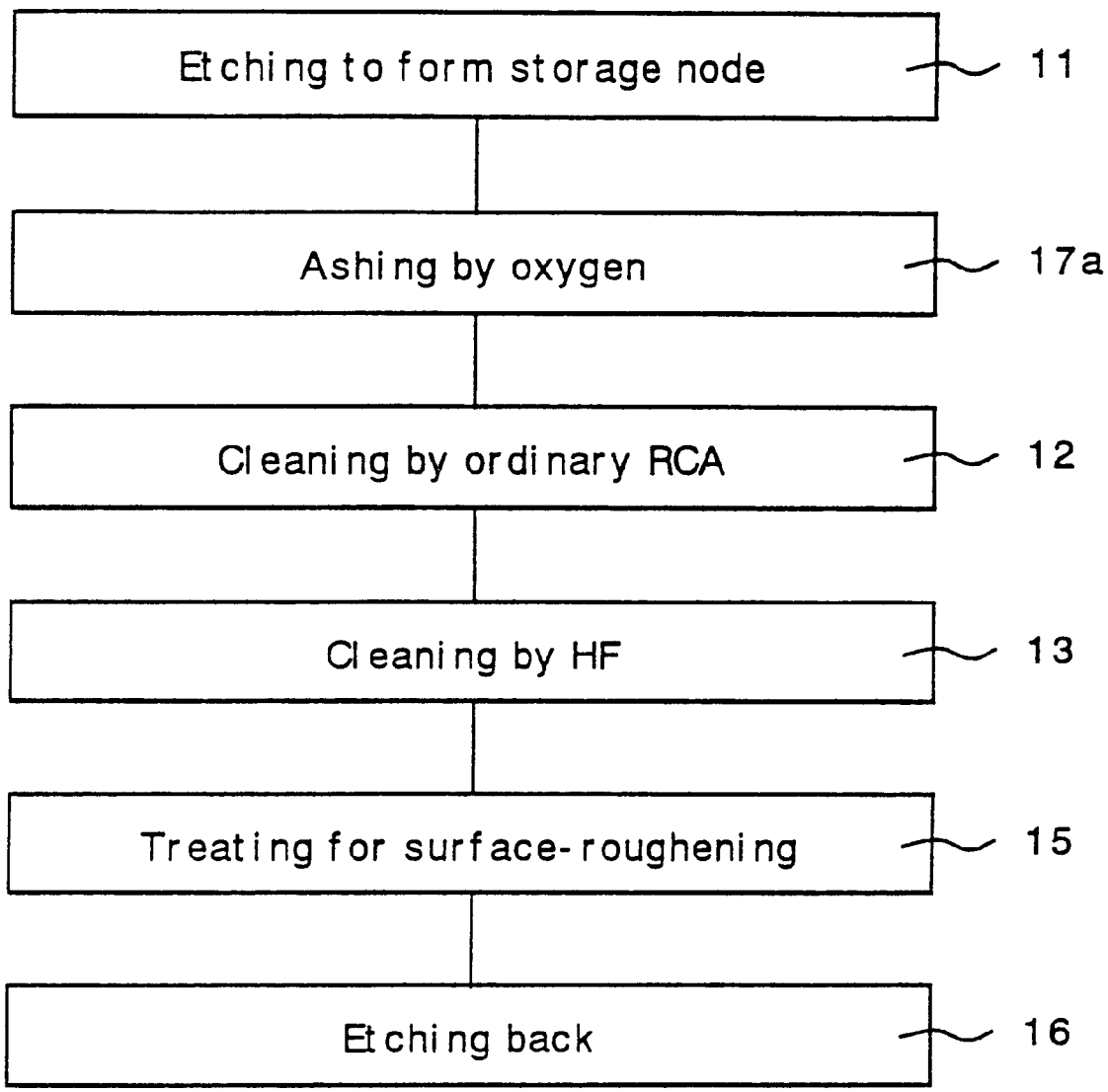
FIG. 12 is a flowchart showing the steps of forming surface-roughened storage nodes according to a fifth embodiment of the present invention.

FIG. 12 is a flowchart showing the steps of forming surface-roughened storage nodes according to a fifth embodiment of the present invention.

In the steps of the fifth embodiment shown in the flowchart of FIG. 12, etching for forming storage nodes in step 11, RCA cleaning in step 12 and cleaning with hydrofluoric acid in step 13 are effected in the same manner as in the first embodiment. After etching for the formation of a pattern of the storage nodes, there is a step of removing a resist by which the pattern is determined.

In the fifth embodiment, oxygen ashing for removing organic material is effected, such that an oxide film having a given thickness is formed on the storage nodes 2. For example, the oxide is formed in a thickness of 20 to 40 angstroms. RCA cleaning in the next step 12 is carried out in an ordinary manner.

Next, in HF cleaning in step 13, treatment time of the hydrofluoric acid is controlled such that the oxide film has a thickness ranging from 0.5 angstroms to 20 angstroms upon completion of the treatment and prior to a subsequent step of forming a nucleating film. For example, where an aqueous 1% hydrofluoric acid solution is used, the oxide film can be removed by 30 angstroms in 35 seconds, from which the HF treating time can be determined.

Next, roughening treatment, in step 15, and etching back treatment, in step 16, are effected in the same manner as in the first embodiment. The step of forming a very thin oxide film, such as in step 14a, of the first or second embodiment is not carried out in this embodiment.

In this method, roughening grains can be formed on the surface of storage nodes as in the first embodiment, and a device yield using this method is comparable to that of the first embodiment.

As set out above, the roughened surface ensures good electric conduction and can be uniformly formed on the surface of the conductive film. In this way, surface-roughened storage nodes having a high capacitance factor can be formed in semiconductor memories.

Sixth embodiment

Figure 13:
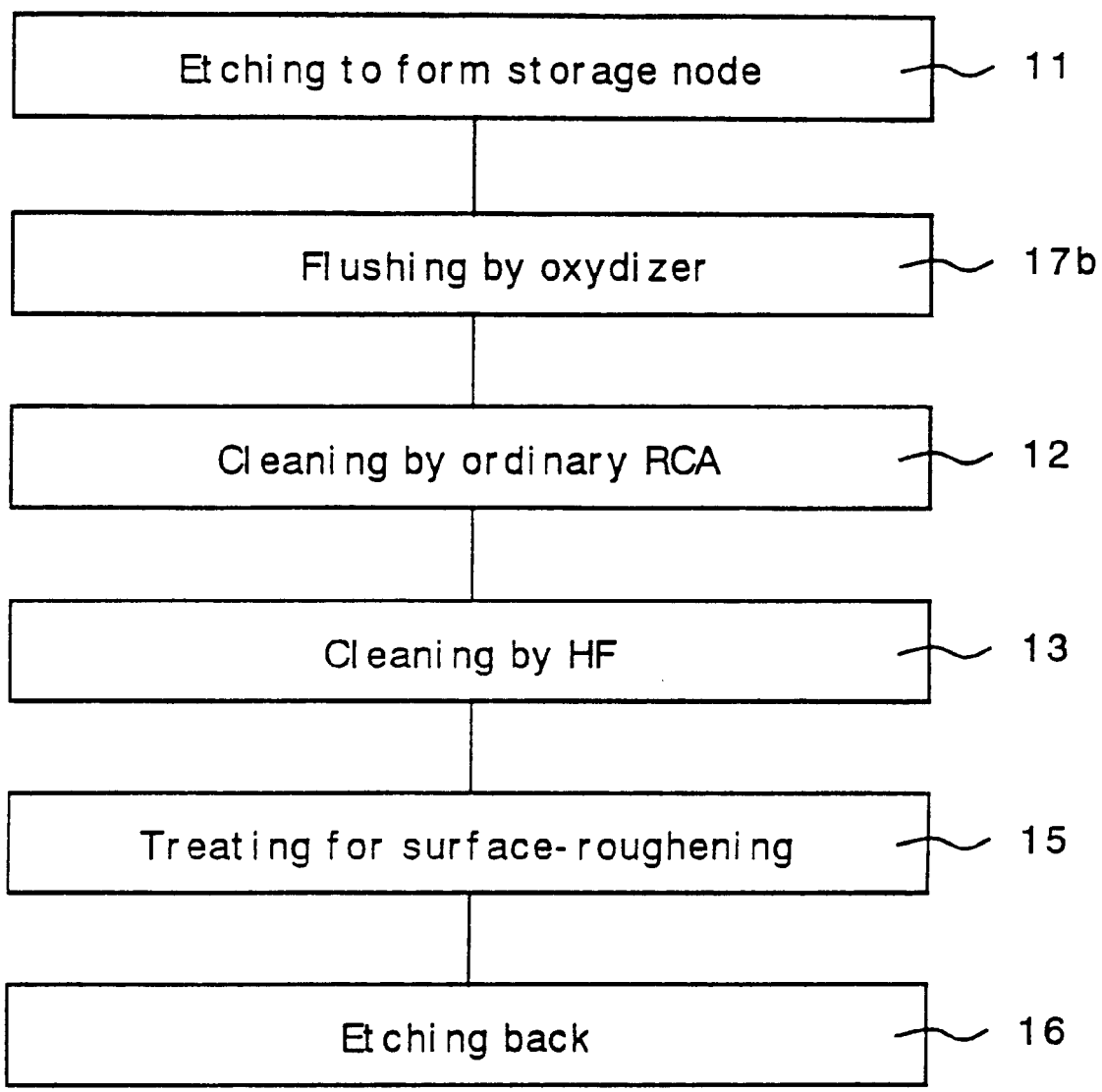
FIG. 13 is a flowchart showing the steps of forming surface-roughened storage nodes according to a sixth embodiment of the present invention.
Figure 14A:
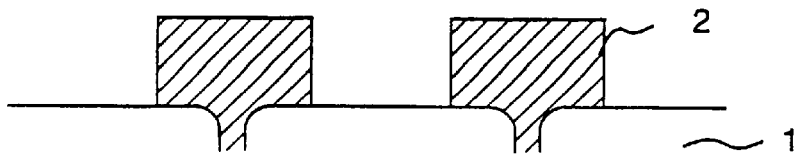
FIGS. 14(a) to 14(c) show schematic views of a process of forming storage nodes according to a conventional method.
Figure 14B:
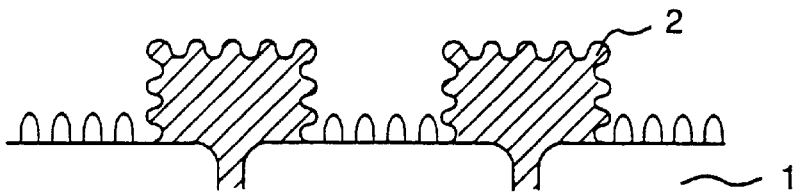
Figure 14C:
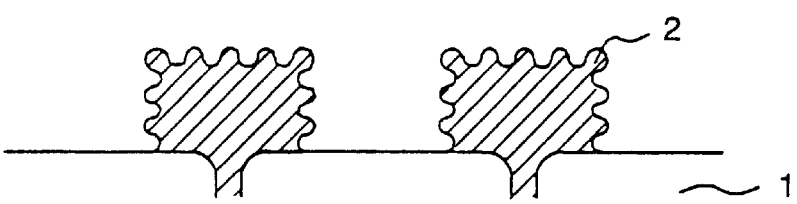
Figure 15:
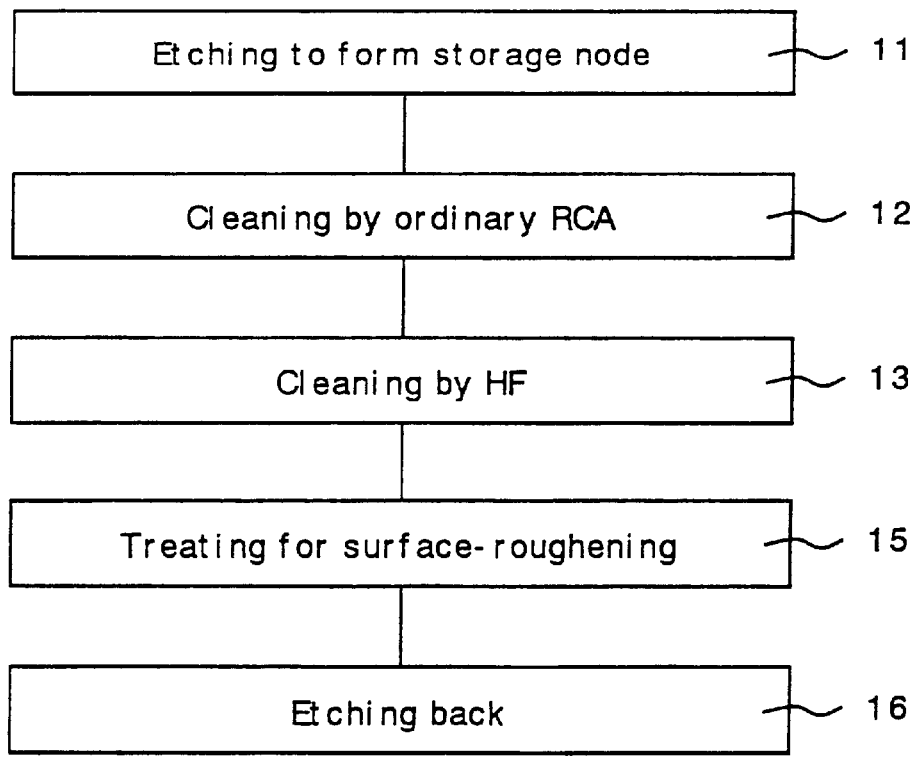
FIG. 15 is a flowchart showing a process for forming storage nodes according to a conventional method.

FIG. 13 is a flowchart showing the steps of forming surface-roughened storage nodes according to a sixth embodiment of the present invention.

In the steps of the sixth embodiment shown in the flowchart of FIG. 13, etching for forming storage nodes in step 11 is effected in the same manner as in the first embodiment.

In the sixth embodiment, flushing by an oxidizer is effected as step 17b as a finishing in the etching process of forming a pattern of storage nodes. For the flushing with an oxidizer, a plasma discharge treatment in an atmosphere of oxygen is continuously carried out in an etching devices. In this way, the storage nodes are covered with an oxide film on the surfaces thereof. When measured, the film thickness is found to be in the range of 40 to 45 angstroms. Subsequent RCA cleaning in step 12 is effected in an ordinary manner.

Next, in HF cleaning in step 13, treatment time of a hydrofluoric acid is controlled such that the oxide film has a thickness ranging from 0.5 angstroms to 20 angstroms upon completion of the hydrofluoric acid treatment and prior to a subsequent step of forming a nucleating film. For example, where an aqueous 1% hydrofluoric acid solution is used, the oxide film can be removed by 30 angstroms in 35 seconds, from which the HF treating time can be determined.

Next, roughening treatment, in step 15, and etching back treatment, in step 16, are effected in the same manner as in the first embodiment. The step of forming a very thin oxide film, such as in step 14*a*, of the first or the second embodiment is not carried out in this embodiment.

In this method, roughening grains can be formed on the surface of storage nodes as in the first embodiment, and a device yield using this method is comparable to that of the first embodiment.

As set out above, the roughened surface ensures good electric conduction and can be uniformly formed on the surface of the conductive film. In this way, surface-roughened storage nodes having a high capacitance factor can be formed in semiconductor memories.

Seventh embodiment

A flowchart showing the steps of forming surface-roughened storage nodes according to a seventh embodiment of the present invention may be shown in FIG. 13 as with the case of the sixth embodiment, but is slightly different from that of the sixth embodiment.

In the steps of the sixth embodiment, flushing by an oxidizer is performed continuously in an etching device. In the seventh embodiment, after completion of the etching step, flushing with an oxidizer is freshly effected. More particularly, a plasma discharge treatment in an atmosphere of oxygen is again carried out after completion of the etching step as a finish for the etching process of forming a pattern of storage nodes. In this method, similar results as in the sixth embodiment are obtained.

As set out above, the roughened surface ensures good electric conduction and can be uniformly formed on the surface of the conductive film. In this way, surface-roughened storage nodes having a high capacitance factor can be formed in semiconductor memories.

The effects or advantages of the present invention are summarized as follows. As having set forth hereinabove, according to the present invention, when a surface-roughened conductive film of a semiconductor device is formed, a very thin oxide film is preliminarily formed on the surface of the conductive film, with which well-roughened surfaces can be formed, without leaving any portion which is not roughened. When the oxide film is formed in a very small thickness, electric integrity is ensured.

In this way, a satisfactory roughness on the surfaces of storage nodes of semiconductor memories can be attained, thus ensuring a required capacitance. Moreover, storage nodes of devices can be miniaturized, and the reliability of the device is improved since there is no local portion which is not roughened.

Obviously many modifications and variations of the present invention are possible in the light of the above teachings. It is therefore to be understood that within the scope of the appended claims the invention may by practiced otherwise than as specifically described.

What is claimed is:

1. A method for forming a surface-roughened conductive film on a semiconductor wafer comprising the steps of:

subjecting an amorphous silicon conductive film formed on said semiconductor wafer to treatment with hydrofluoric acid to remove a natural oxide film therefrom;

forming a very thin oxide film having a thickness ranging from 0.5 angstroms to 20 angstroms on the conductive film following said treatment with hydrofluoric acid, by a method selected from the group consisting of treatment with an aqueous hydrogen peroxide solution, flushing treatment with an oxidizer, standing in a clean room, and rinsing by clean water;

forming a nucleating film on said very thin oxide film by use of a silane gas; and annealing said wafer having said nucleating film to roughen the surface of said conductive film.

2. A method for forming a surface-roughened conductive film on a semiconductor wafer comprising the steps of:

etching an amorphous silicon conductive film formed on said semiconductor wafer;

forming an oxide film on said conductive film in the thickness larger than 20 angstroms;

subjecting said semiconductor wafer to treatment with hydrofluoric acid until said oxide film is left as a very thin oxide film having a thickness ranging from 0.5 angstroms to 20 angstroms;

forming a nucleating film on said very thin oxide film by use of a silane gas; and annealing said wafer having said nucleating film to roughen the surface of said conductive film.

3. The method for forming a surface-roughened conductive film according to claim 2, wherein said oxide film is formed by oxygen ashing.

4. The method for forming a surface-roughened conductive film according to claim 1, wherein said oxide film is formed by flushing with an oxidizer.

5. The method for forming a surface-roughened conductive film according to claim 4, wherein said flushing with an oxidizer is performed by continuously carrying out a plasma discharge treatment in an atmosphere of oxygen in an etching device followed by HF cleaning.

6. The method for forming a surface-roughened conductive film according to claim 4, wherein said flushing with an oxidizer is performed by carrying out a plasma discharge treatment in an atmosphere of oxygen after completing an etching step.

* * * * *

UNITED STATES PATENT AND TRADEMARK OFFICE
CERTIFICATE OF CORRECTION

PATENT NO. : 5,963,815
DATED : Oct. 5, 1999
INVENTOR(S) : Okamoto et al.

It is certified that error appears in the above-identified patent and that said Letters Patent is hereby corrected as shown below:

On the Title Page, Column 1, section [30], the Foreign Application Priority Data is printed incorrectly. The correct data should read as follows:

Aug. 11, 1997   [JP].................................................9-216697

Additionally, in the Specification, Column 3, line 32, change FIGS. 9(a) and 9(b) are a schematic view" to FIGS. 9(a) and 9(b) are schematic views--.

Signed and Sealed this

Twenty-fifth Day of April, 2000

*Attest:*

Q. TODD DICKINSON

*Attesting Officer*     *Director of Patents and Trademarks*